United States Patent
Cunningham et al.

(10) Patent No.: US 8,673,671 B2
(45) Date of Patent: Mar. 18, 2014

(54) METHODS AND DEVICES FOR FABRICATING TRI-LAYER BEAMS

(71) Applicant: Wispry, Inc., Irvine, CA (US)

(72) Inventors: Shawn J. Cunningham, Irvine, CA (US); Dana R. DeReus, Santa Ana, CA (US); Arthur S. Morris, III, Raleigh, NC (US)

(73) Assignee: Wispry, Inc., Irvine, CA (US)

( * ) Notice: Subject to any disclaimer, the term of this patent is extended or adjusted under 35 U.S.C. 154(b) by 0 days.

(21) Appl. No.: 13/681,045

(22) Filed: Nov. 19, 2012

(65) Prior Publication Data

US 2013/0143347 A1    Jun. 6, 2013

Related U.S. Application Data

(62) Division of application No. 12/178,554, filed on Jul. 23, 2008, now Pat. No. 8,319,312.

(60) Provisional application No. 60/961,591, filed on Jul. 23, 2007, provisional application No. 60/961,649, filed on Jul. 23, 2007.

(51) Int. Cl.
*H01L 21/00* (2006.01)

(52) U.S. Cl.
USPC ..................... 438/53; 257/E21.495

(58) Field of Classification Search
USPC ............... 438/411, 422, 619; 257/E21.495
See application file for complete search history.

(56) References Cited

U.S. PATENT DOCUMENTS

| 5,274,904 | A | 1/1994 | Proise |
| 6,635,506 | B2 * | 10/2003 | Volant et al. ............ 438/52 |
| 6,917,086 | B2 | 7/2005 | Cunningham et al. |
| 7,886,429 | B2 * | 2/2011 | Krippner et al. ........ 29/831 |
| 8,319,312 | B2 | 11/2012 | Morris, III et al. |
| 2003/0119221 | A1 | 6/2003 | Cunningham et al. |
| 2004/0097066 | A1 | 5/2004 | Ozgur |
| 2005/0181559 | A1 | 8/2005 | Natori et al. |

FOREIGN PATENT DOCUMENTS

| CN | 1695233 | 11/2005 |
| WO | WO 03042721 | 5/2003 |

OTHER PUBLICATIONS

U.S. Appl. No. 12/178,554, filed Jul. 23, 2008.
International Search Report and Written Opinion corresponding to PCT International Application No. PCT/US08/70937 dated Oct. 1, 2008.
Official Action with Restriction/Election Requirement corresponding to U.S. Appl. No. 12/178,554 dated Jun. 28, 2011.
Chinese Office Action for Appl. No. 200880108379.0 with English translation dated Jul. 27, 2011.
Non-Final Office Action for U.S. Appl. No. 12/178,554 dated Oct. 12, 2011.
Final Office Action for U.S. Appl. No. 12/178,554 dated Feb. 28, 2012.

(Continued)

*Primary Examiner* — Chandra Chaudhari
(74) *Attorney, Agent, or Firm* — Jenkins, Wilson, Taylor & Hunt, P.A.

(57) ABSTRACT

Methods and devices for fabricating tri-layer beams are provided. In particular, disclosed are methods and structures that can be used for fabricating multilayer structures through the deposition and patterning of at least an insulation layer, a first metal layer, a beam oxide layer, a second metal layer, and an insulation balance layer.

19 Claims, 9 Drawing Sheets

(56) References Cited

OTHER PUBLICATIONS

Chinese Office Action for Application Serial No. CN 200880108379 dated Jun. 26, 2012.

Chinese Office Action for Application No. 200880108379.0 dated Jan. 21, 2013.

Chinese Notice of Grant for Application No. 200880108379.0 dated Jul. 25, 2013.

* cited by examiner

METHODS AND DEVICES FOR FABRICATING TRI-LAYER BEAMS

RELATED APPLICATIONS

This application is a divisional patent application which claims the benefit of the filing date of U.S. patent application Ser. No. 12/178,554 filed Jul. 23, 2008, which claims priority to and the benefit of U.S. Provisional Patent Application Ser. No. 60/961,591, filed Jul. 23, 2007, and also U.S. Provisional Patent Application Ser. No. 60/961,649, filed Jul. 23, 2007, the disclosures of which are incorporated herein by reference in their entireties. This application is also related to U.S. Utility Patent Application Ser. No. 12/178,563, filed Jul. 23, 2008, which is also incorporated in its entirety by reference herein.

TECHNICAL FIELD

The present subject matter generally relates generally to micro-electro-mechanical systems (MEMS) methods and devices. More particularly, the present subject matter relates to methods and devices for fabricating tri-layer beams and other multilayer structures.

BACKGROUND

Micro electro-mechanical systems (micromachines or MEMS devices) have a wide variety of applications and are becoming more prevalent in commercial products. MEMS devices are ideal for wireless devices because of their low power and loss along with high isolation and linearity characteristics operating in radio frequency (RF) ranges. In particular, MEMS devices are well suited for applications including cellular telephones, wireless networks, communication systems, and radar systems. In wireless devices, MEMS devices can be used as antenna switches, mode switches, transmit/receive switches, tunable filters, matching networks and the like.

One particular example of a structure used in MEMS devices is a tri-layer beam. Such a structure has been shown to provide reliable, repeatable performance in MEMS devices. Tri-layer beams are fabricated by any number of techniques with the fundamental idea being the formation of structure that has three functional layers, namely a second functional layer is deposited on a first and a third functional layer is deposited on the second. The first and third layers can be the same to create a high degree of geometric, mechanical, and thermomechanical symmetry.

SUMMARY

In one aspect, the presently disclosed subject matter provides a multilayer structure for a micro electro-mechanical device. The multilayer structure can include a substrate, a lower sacrificial layer deposited on the substrate, an insulation layer deposited on the lower sacrificial layer, a first metal layer deposited on the insulation layer, a beam oxide layer deposited on the first metal layer, a second metal layer deposited on the beam oxide layer, and an insulation balance layer deposited on the second metal layer. The deposited layers can be patterned and etched to define a multilayer structure.

In another aspect, the presently disclosed subject matter provides a method for fabricating a multilayer structure for a micro electro-mechanical device. The method can include depositing a lower sacrificial layer on a substrate, patterning the lower sacrificial layer into isolated islands, depositing an insulation layer on the substrate and the lower sacrificial layer, depositing a first metal layer on the insulation layer, depositing a beam oxide layer on the first metal layer, depositing a second metal layer on the beam oxide layer, depositing an insulation balance layer on the beam oxide layer and second metal layer, creating perimeter and release holes in one or more of the deposited layers, and etching away the lower sacrificial layer through the perimeter and release etch holes.

In yet another aspect, the presently disclosed subject matter provides another method of fabricating a multilayer structure for a micro electro-mechanical device. The method can include depositing a base metal layer on a substrate, encapsulating the base metal layer with a dielectric layer, depositing a lower sacrificial layer on the substrate, patterning the lower sacrificial layer into isolated islands, depositing an insulation layer on the substrate and the lower sacrificial layer, depositing a first metal layer on the insulation layer on the substrate, depositing a beam oxide layer on the first metal layer, depositing a second metal layer on the beam oxide layer, depositing an insulation balance layer on the beam oxide layer and the second metal layer, creating perimeter and release holes in one or more of the deposited layers, and etching away the lower sacrificial layer through the perimeter and release etch holes. In this aspect, a capacitor can be defined between the base metal layer and the first metal layer.

Additional features of the presently disclosed subject matter will become evident as the description proceeds when taken in connection with the accompanying drawings as described hereinbelow.

BRIEF DESCRIPTION OF THE DRAWINGS

The subject matter described herein will now be explained with reference to the accompanying drawings of which.

DETAILED DESCRIPTION

In accordance with the present disclosure, methods and devices for fabricating tri-layer beams are provided. The tri-layer beams described herein can have particular application for use in MEMS devices, systems, and methods for a variety of communication applications.

Tri-layer beams provide a relatively simple construction that provides temperature and film stress balance. Stress balance is important to control the shape of a fabricated device, whereas temperature balance is important for low temperature coefficients. The fabrication of the tri-layer beam can be made easier to manufacture and more robust is some scenarios by the addition of insulation (IL) and insulation balance (IBL) layers. In a typical situation, the mechanics and electromechanics are dominated by the fundamental tri-layer structure, and thus the addition of the added layers of insulation and insulation balance do not substantially affect the operation of the MEMS device.

Various methods can be used to fabricate tri-layer beams to result in the most stress- and temperature-balanced structure. This disclosure includes description of specific methods that can be used to fabricate tri-layer beams by implementing an insulation layer and an insulation balance layer. These methods apply to other multilayer structures as well, and thus the use of the insulation layer and insulation balance layer are not limited to the construction of tri-layer structures.

As indicated above, the basic make-up of a tri-layer beam is a metal-dielectric-metal sandwich. A first metal layer can be deposited on a lower sacrificial layer and patterned. This step can be followed by the deposition of a dielectric layer and the deposition of a second metal layer. The second metal layer can be patterned followed by the patterning and etching of the dielectric layer to form the basic outline of the structure. If the lower sacrificial layer is not etched by the metal etch or otherwise damaged by the photolithography process, the simple process flow is adequate. When the lower sacrificial layer is etched or otherwise compromised by the metal etch or the photolithography process (i.e. polyimide is attacked or etched by the metal etch and the photolithography process), the lower sacrificial layer will need to be protected from these processes.

One approach is to encapsulate the lower sacrificial layer in a material that is not etched (or etched minimally) by the metal etch or the photolithography process. The encapsulation material selection will depend on the metal being etched and the photolithography chemicals being used. For instance, in one specific case, the lower sacrificial layer can be polyimide. The polyimide sacrificial layer can be encapsulated in an oxide layer that acts as the capacitor dielectric. An insulating layer can be provided to prevent shorting of actuator plates, protect the lower sacrificial layer, partially encapsulate the first metal layer, serve as an etch stop for the metal etch, and protect the metal for the sacrificial etch if the metal can be etched by the sacrificial release etch chemistry. The polyimide can then be removed by an oxygen plasma that will not attack the metals or the dielectric.

The added insulation and insulation balance layers are compatible with a conventional complementary metal-oxide semiconductor (CMOS) process sequence that alternates metal and oxide depositions, that uses the oxide as a dielectric insulator and/or a capacitor dielectric, and that uses the metal as an oxide etch stop (electrical via terminations) and the oxide as a metal etch stop.

The tri-layer beam structure described herein can help to maximize the symmetry of the tri-layer cross-section, where the symmetry is defined in terms of geometric, material, and process properties. Further, the success of the insulation layer depends on its ability to act as an etch stop for the metal etch, to act as the capacitor dielectric and support the maximum voltage drops, and to act as a protective encapsulation that protects the metal from both the sacrificial etch and the environment.

For purpose of the description herein, it is understood that when a component such as a layer or substrate is referred to as being "disposed on", "attached to", or "formed on" another component, that component can be directly on the other component or, alternatively, intervening components (for example, one or more buffer or transition layers, interlayers, electrodes, or contacts) can also be present. Furthermore, it is understood that the terms "disposed on", "attached to", and "formed on" are used interchangeably to describe how a given component can be positioned or situated in relation to another component. Therefore, it will be understood that the terms "disposed on", "attached to", and "formed on" do not introduce any limitations relating to particular methods of material transport, deposition, or fabrication.

Contacts, interconnects, conductive vias, electrothermal components, and electrodes of various metals can be formed by sputtering, CVD, evaporation, or electroplating. Some metals might require an appropriate intermediate adhesion layer to prevent peeling. Examples of adhesion material often used include chromium, titanium, or an alloy such as titanium-tungsten (TiW) or titanium-nitride (TiN). Some metal combinations can require a diffusion barrier to prevent an adhesion layer from diffusing through the metal and vice versa.

Conventional lithographic techniques can be employed in accordance with fabrication, such as micromachining, of the subject matter described herein. Accordingly, basic lithographic process steps such as photoresist application, optical exposure, and the use of developers are not described in detail herein.

Similarly, generally known etching processes can be suitably employed to selectively remove material or regions of material. An imaged photoresist layer is ordinarily used as a masking template. A pattern can be etched directly into the bulk of a substrate, or into a thin film or layer that is then used as a mask for subsequent etching steps.

The type of etching process employed in a particular fabrication step (e.g., wet, dry, isotropic, anisotropic, anisotropic-orientation dependent), the etch rate, and the type of enchant used will depend on the composition of material to be removed, the composition of any masking or etch-stop layer to be used, and the profile of the etched region to be formed.

Dry etching techniques such as plasma-phase etching and reactive ion etching (RIE) can also be used to remove silicon and its oxides and nitrides, as well as various metals. Deep reactive ion etching (DRIE) can be used to anisotropically etch deep, vertical trenches in bulk layers. Silicon dioxide is typically used as an etch-stop against DRIE, and thus structures containing a buried silicon dioxide layer, such as silicon-on-insulator (SOI) wafers, can be used according to this disclosure as starting substrates for the fabrication of microstructures.

An alternative patterning process to etching is the lift-off process as known to those of skill in the art. In this case, the conventional photolithography techniques are used for the negative image of the desired pattern. This process is typically used to pattern metals, which are deposited as a continuous film or films when adhesion layers and diffusion barriers are needed. The metal is deposited on the regions where it is to be patterned and on top of the photoresist mask (negative image). The photoresist and metal on top are removed to leave behind the desired pattern of metal.

As used herein, the term "device" is interpreted to have a meaning interchangeable with the term "component." As used herein, the term "conductive" is generally taken to encompass both conducting and semi-conducting materials.

Embodiments of methods and devices for fabricating tri-layer beams in accordance with the subject matter disclosed herein will now be described with reference to FIGS. 1 through 36.

In one aspect, the presently disclosed subject matter provides a method for fabricating a tri-layer beam, such as is illustrated in FIGS. 1 through 12. This method can first include providing a substrate. The substrate can be formed from any of a variety of materials, including silicon (Si), glass (Pyrex), sapphire, gallium arsenide (GaAs), ceramic, aluminum (Al), or any other common substrate material for fabricating MEMS. The material can be selected to be compatible with the deposition temperatures. The substrate can be any size, with commonly-used dimensions including 100, 150, and 200 mm. In one particular example, the substrate can be a silicon substrate that contains a CMOS design, high voltage CMOS (HVCMOS), or other fabricated integrated circuit, which can include transistors, diodes, diffused/implanted layers, aluminum or copper interconnects, oxides/nitrides, and metal interconnects.

Figure 1:
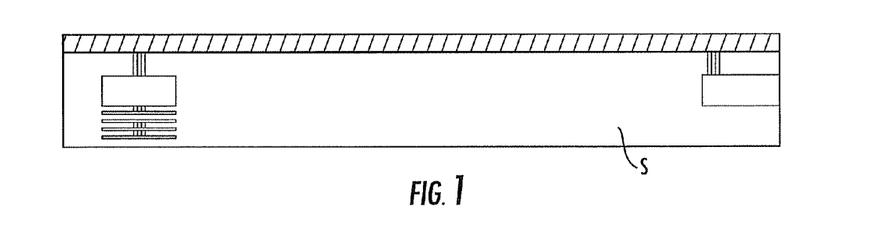
FIGS. 1 through 12 are cross-sectional side views of progressive steps that can occur in the fabrication of a multilayer structure according to the subject matter disclosed herein.

Referring to FIG. 1, the method can further include depositing a lower sacrificial layer S1 on the substrate. Lower sacrificial layer S1 can be an organic polymer (photoresist, polyimide), an inorganic dielectric (SG, PSG, BPSG), a metal (Al, Cu), or any other suitable material used for the manufacture of MEMS or other air gap devices. In particular, lower sacrificial layer S1 can be silicon, polycrystalline silicon (polysilicon), or amorphous silicon. Lower sacrificial layer S1 can be doped or undoped, and the doping can be introduced to enhance etch selectivity or to provide a doping source for structural layers.

Lower sacrificial layer S1 can be deposited on the substrate by any of a number of deposit techniques, including for example and without restriction spin-on, sputtering, evaporation, or electroplating. The specific method used should be consistent with depositing the desired thickness in a cost effective fashion. In one example, lower sacrificial layer S1 can be a polyimide that is deposited by a spin-on process, soft-cured, photo-imaged, and annealed at high temperatures (~400° C.) for final cure and out-gassing. Lower sacrificial layer S1 can be deposited in a single layer or in multiple layers. For instance, lower sacrificial layer S1 can be deposited and patterned in two layers and used to achieve one or more functional purposes, including forming electrostatic actuator air-gaps, forming capacitor air gaps, forming contact bumps, and/or forming isolation stand-off bumps.

Figure 2:
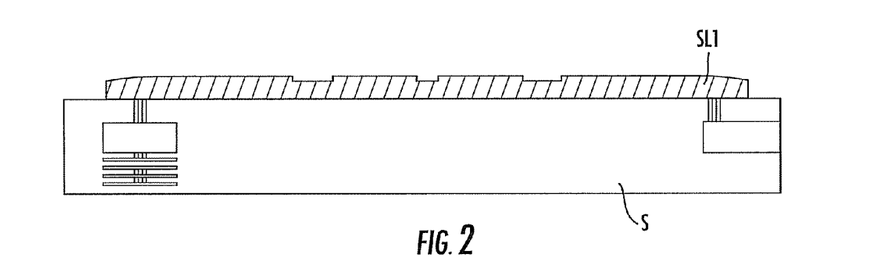

As is illustrated in FIG. 2, lower sacrificial layer S1 can be patterned into isolated islands. Lower sacrificial layer S1 can be patterned by any of a number of techniques, including lift-off, electroplating, photo-masking and etching (e.g., wet or dry chemical etching or physical etching), and photo-imaging and development process (i.e., photoresist development). For example, lower sacrificial layer S1 can be a polyimide layer that is patterned by photo-imaging and photo-development. Alternatively, lower sacrificial layer S1 can be a silicon layer that is patterned by photomasking and etching. In yet a further alternative, lower sacrificial layer S1 can be a copper layer that is electroplated and patterned by the photoresist electroplating template. Further still, lower sacrificial layer S1 can be a copper layer that is sputtered and patterned by lift-off techniques. Regardless of the specific method used, lower sacrificial layer S1 should be fully removed and cleaned from all interfaces where it is not part of an isolated island. In addition, the remaining portions of lower sacrificial layer S1 can be planarized. Lower sacrificial layer S1 can require high temperature anneals to control stress, outgassing, material properties or other factors.

Figure 3:
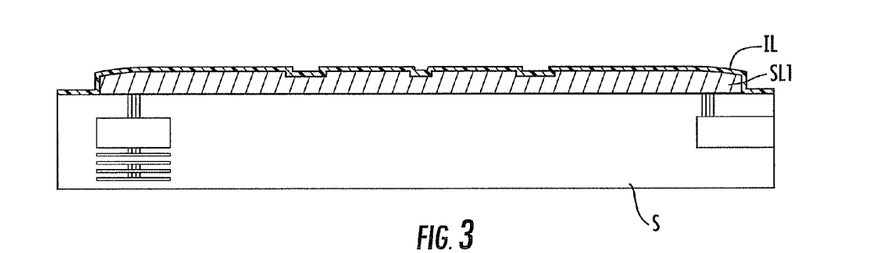

The method for fabricating the tri-layer beam can then include depositing an insulation layer IL on top of one or both of the substrate and lower sacrificial layer S1, which is illustrated in FIG. 3. Insulation layer IL can provide multiple functions to the tri-layer beam. First, it can serve as an etch stop for the patterning of later-deposited metal layers in the course of the fabrication of the tri-beam structure. In this role, insulation layer IL should be robust enough to survive any etching of an overlying metal layer to produce clean, non-conductive surfaces and to eliminate or reduce the potential for stringer metallization. Insulation layer IL itself generally should not be patterned and etched on top of lower sacrificial layer S1 for which it is to provide a barrier. Rather, it will only be etched to provide a via interconnection between metal layers, so this via etch will always terminate on an underlying metal layer.

Second, insulation layer IL can otherwise serve as a protective layer for lower sacrificial layer S1. Generally, insulation layer IL need not be patterned or etched to expose lower sacrificial layer S1 until all structural metal layers have been deposited and patterned. Because insulation layer IL can remains unpatterned on lower sacrificial layer S1, it can provide a protective barrier to any subsequent etches or photolithography steps that follow the deposition of insulation layer IL. In some processes, insulation layer IL can be patterned and etched after its deposition as long as this pattern does not terminate on lower sacrificial layer S1. For instance, it is typical to pattern and etch electrical via interconnections to an underlying metal layer, but it would be less typical to pattern and etch a via terminating in field oxide. The requirements for this layer can depend on the lower sacrificial layer that is used and the subsequent chemical processes that it could be exposed to during the process. In one particular example, insulation layer IL can be used in conjunction with a polyimide sacrificial layer. Insulation layer IL can protect the polyimide layer from exposure to an etching process and any subsequent photoresist strips. If insulation layer IL were not present, the polyimide sacrificial layer would be exposed to the sacrificial etch and to the photoresist strip process that would undercut the overlying metal layer and compromise the integrity of the structure. The same would be true if insulation layer IL was in place but patterned or etched on top of lower sacrificial layer S1.

Third, insulation layer IL can serve as a capacitor dielectric. For instance, insulation layer IL can define some portion of the dielectric of a fixed capacitor, a tunable/actuatable capacitor, or an interlayer dielectric between metal interconnects. In one particular example, in the 'OPEN' state, the capacitor gap can be dominated by a nominal 2 µm air space compared to 0.15 µm of an oxide insulation layer IL and 80 Å of another oxide layer (e.g., a SIP oxide) on top of an underlying metal layer. In the 'CLOSED' state, the oxide insulation layer IL can dominate the capacitance density because of its thickness compared to the other contributor, the SIP oxide layer. The thickness of insulation layer IL can be targeted typically on the basis of the etch stop and protection functions. The minimum thickness of the capacitor dielectric layer (i.e., the combined thickness of insulation layer IL and the SIP oxide layer) is determined by reliability in terms of leakage and breakdown. The maximum thickness of the capacitor dielectric layer is determined by the functional capacitance density. For instance, insulation layer IL can comprise a dominant fraction of the capacitor dielectric. From a capacitor dielectric requirement, the thickness of the dielectric layer can be distributed between the SIP oxide layer and insulation layer IL to best optimize and simplify the process. In one specific example, if insulation layer IL could be eliminated, the SIP oxide layer could be targeted at 0.15 µm to eliminate a deposition step and reduce the number of steps that are used to define a critical dimension that is the capacitor dielectric thickness. In another example, insulation layer IL thickness of 0.15 µm and oxide layer thickness of 80 Å can optimize the capacitance density, capacitor reliability, etch stop capability, and sacrificial layer protection.

Fourth, insulation layer IL can provide encapsulation and isolation of metal layers and lines and can improve breakdown of high voltage elements. Insulation layer IL can be used in combination with another layer (e.g., a beam oxide layer described below) to completely encapsulate a metal layer in oxide to limit the exposure of the metal to any subsequent process or environmental conditions.

Structurally, insulation layer IL can be a continuous, contiguous, conformal layer that encapsulates the patterned sacrificial layer. One common example of an insulation layer IL is a dielectric, such as silicon nitride, silicon oxide, or other high-k or low-k dielectric. By way of specific example, insulation layer IL can be a CMOS-compatible silicon oxide with a dielectric constant of about 4 and a thickness of about 500 Å to 1500 Å. The thickness of insulation layer IL formed can be selected based one or more factors, including: 1) the ability to act as an etch stop for subsequent metal etches without the etch penetrating insulation layer IL to the underlying lower sacrificial layer S1; 2) the ability to provide a leakage barrier and to support the voltage across metal layers (i.e. the breakdown voltage can advantageously be greater than about 40 VDC/RF); 3) the ability to provide a specific capacitance density for a fixed capacitor or a tunable capacitor; and/or 4) the ability to provide a barrier for subsequent etch or photolithography steps. For instance, for a polyimide lower sacrificial layer S1 insulation layer IL can advantageously provide a barrier to a subsequent photostrip process that will attach and remove the polyimide. For a harder lower sacrificial layer S1, such as silicon, it can be less important for the insulation layer IL to provide the protection depending on whether the silicon etch will attach any of the metal/metal cladding layers.

Figure 4:
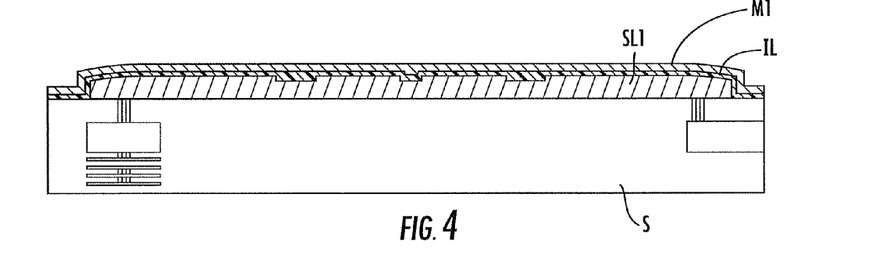
Figure 5:
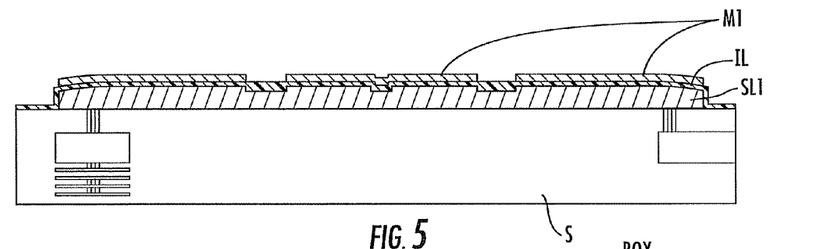

Referring next to FIGS. 4 and 5, a first metal layer M1 can be deposited on insulation layer IL on the substrate. First metal layer M1 can be a CMOS-compatible aluminum (e.g., Al-0.5% Cu, Al-1% Si, etc.) in addition to the cladding layers that are typical for the CMOS process, such as an adhesion layer/diffusion barrier composed of titanium/titanium nitride, gold, and/or copper. First metal layer M1 can be patterned to define actuator electrodes, capacitor electrodes for fixed or tunable capacitors, switch contacts (with appropriate contact alloys), inductor coils, bond pads, or other metal interconnect structures. The thickness of first metal layer M1 can be designed to meet functional requirements for conductivity, electro-thermal response for conduction of heat and electrical power, mechanical requirements (e.g., natural frequency and higher frequency modes, switching time) and electro-mechanical response (e.g., pull-in voltage, release voltage, self-actuation voltage).

In one example, first metal layer M1 can be a 0.52 μm-thick layer of aluminum (e.g., Al-0.5% Cu) plus any cladding materials. First metal layer M1 can be patterned on the portions of the substrate that do not have sacrificial islands or on the sacrificial islands themselves. If first metal layer M1 is patterned on the lower sacrificial layer S1, it can be part of a suspended/movable structure or it can be part of a fixed structure. If it is part of a movable structure, first metal layer M1 can form movable capacitor plates, movable actuator plates, and/or movable switch contacts. First metal layer M1 can be patterned by electroplating through a patterned electroplating template, which can require the deposition of a seed layer. Alternatively, first metal layer M1 can be patterned by lift-off using an appropriate lift-off template, by wet etching with an appropriate etch mask, or by dry etching with an appropriate etch mask. Insulation layer IL should have excellent selectivity to the wet/dry metal etches or mask stripping process.

Figure 6:
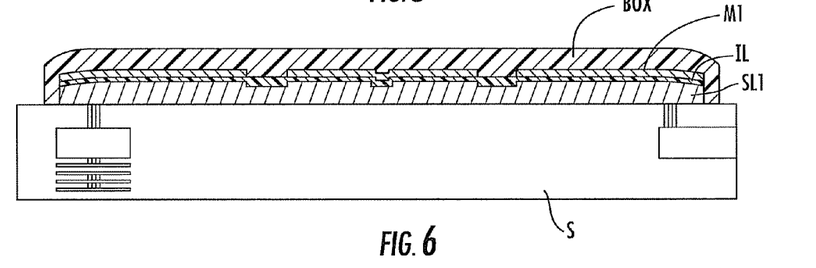

A beam oxide layer BOX can further be deposited over first metal layer M1, which is depicted in FIG. 6. Beam oxide layer BOX can be a continuous, contiguous, conformal layer that can encapsulate first metal layer M1. The thickness of beam oxide layer BOX can be selected to satisfy mechanical and electromechanical requirements (pull-in voltage, self-actuation, release voltage, switching time, natural frequency). Beam oxide layer BOX can be a dielectric layer, such as a layer of silicon oxide, silicon nitride, aluminum oxide. For instance, beam oxide layer BOX can be a layer of SiO that is about 2 μm thick.

Beam oxide layer BOX can also be patterned to etch vias for electrical connection between first metal layer M1 and a second metal layer M2 (discussed below). The electrical interconnection can be completed with a conformal filling of the via by second metal layer M2 for a conformal process. If the beam process is planarized, the via electrical connection can be formed by any filled via technique. For example, the via technique can involve CMP-oxide first, then CMP fill material (e.g., W), or electroplate stud first and CMP dielectric second to expose the conductive stud. The vias can be made on and off the lower sacrificial layer S1 but terminate of first metal layer M1.

Generally, beam oxide layer BOX need not be patterned enough to expose lower sacrificial layer S1. Further, the patterning and etching of beam oxide layer BOX to define the device shape can be deferred until after the etching of second metal layer M2 and the deposition of an insulation balance layer IBL. Waiting until after these steps are performed to pattern and etch beam oxide layer BOX ensures that beam oxide layer BOX both provides protection for lower sacrificial layer S1 during etching of second metal layer M2 and subsequent photodevelopment processes and simplifies the metal etch, because the metal does not need to be removed from steep or deep sidewalls. Accordingly, insulation layer IL, beam oxide layer BOX, and insulation balance layer IBL can be etched simultaneously to define the beam shape. This avoids a multitude of overplot design rules and minimizes the area usage.

Figure 7:
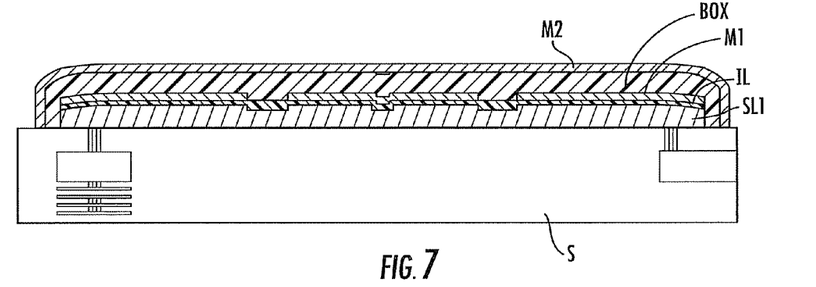
Figure 8:
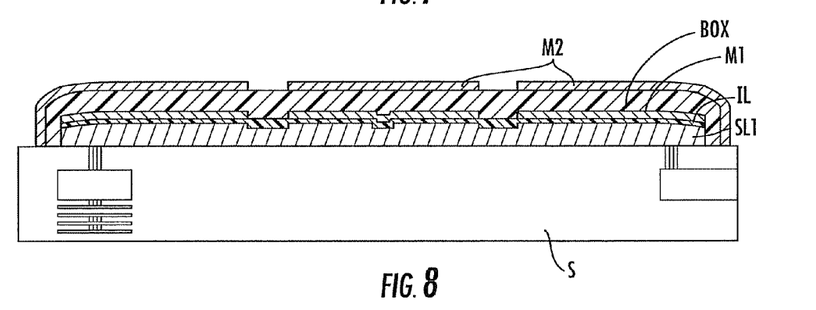

Referring to FIGS. 7 and 8, the second metal layer M2 can be deposited over beam oxide layer BOX. Second metal layer M2 can serve the purpose of providing symmetric balance to first metal layer M1 for a freely suspended tri-layer beam. In addition, second metal layer M2 can make electrical contact to the first metal layer M1 through the vias etched in the beam oxide layer BOX. Second metal layer M2 can be composed of a CMOS compatible aluminum (e.g., Al-0.5% Cu, Al-1% Si, etc.) in addition to cladding layers (e.g., adhesion layer/diffusion barrier) that are typical for the CMOS process, such as titanium/titanium nitride, gold, or copper. Second metal layer M2 can be patterned to define actuator electrodes, capacitor electrodes for fixed or tunable capacitors, switch contacts (with appropriate contact alloys), inductor coils, bond pads, or other metal interconnect structures. Further, second metal layer M2 can be patterned by etching, with beam oxide layer BOX effectively forming the insulation layer for the second metal layer etch. The thickness of second metal layer M2 can be designed to meet functional requirements for conductivity, electro-thermal response for conduction of heat and electrical power, mechanical requirements (natural frequency and higher frequency modes, switching time), and electro-mechanical response (pull-in voltage, release voltage, self-actuation voltage).

In one example, second metal layer M2 can be a 0.52 μm-thick layer of aluminum (e.g., Al-0.5% Cu), plus cladding. Similar to the first metal layer, second metal layer M2 can be patterned by electroplating through a patterned electroplating template, which can require the deposition of a seed layer. Alternatively, second metal layer M2 can be patterned by lift-off using an appropriate lift-off template, by wet etching with an appropriate etch mask, or by dry etching with an appropriate etch mask. Insulation layer IL should have excellent selectivity to the wet/dry metal etches or mask stripping process.

Figure 9:
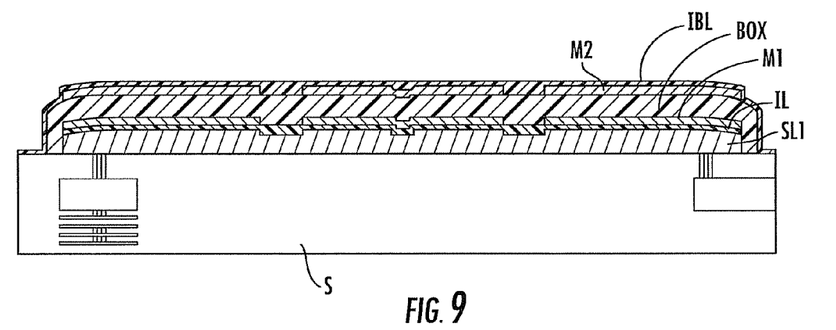

An insulation balance layer IBL can be deposited on top of beam oxide layer BOX and second metal layer M2, as is illustrated in FIG. 9. As is noted above, insulation balance layer IBL can be added for the mechanical and thermo-mechanical balance of the beam, thereby compensating for the addition of insulation layer IL. Insulation balance layer IBL can be deposited using the same material and same thickness as insulation layer IL to provide a high degree of symmetry, which can be defined in terms of geometric, mechanical, and thermomechanical symmetry. For instance, insulation balance layer IBL can be an oxide layer (e.g., SiO) that is 500 Å to 1500 Å thick. In this form, the primary functional purpose for insulation balance layer IBL can be to match insulation layer IL.

A secondary purpose of insulation balance layer IBL can be to encapsulate second metal layer M2 and to provide mechanical compensation. A cumulative effect of the layer deposition can result in some stress gradient that can curve the as-released beam shape. Insulation balance layer IBL, being the last deposited layer, can thus provide at least some compensation for stress gradients and shape. For example, the cladding-metal sequence can be Ti—TiN-Al—Ti—TiN, but the second sequence of Ti—TiN can be thicker than the first, setting up the slight asymmetry. In addition, other asymmetries can be set up by stress gradients through the beam, which means the insulation balance layer IBL can compensate for secondary factors such as slight geometric asymmetries created by cladding construction of conformal processes and as stress gradient asymmetries. Of course, there are trade-offs between the degree of compensation versus the degree of symmetry.

Figure 10:
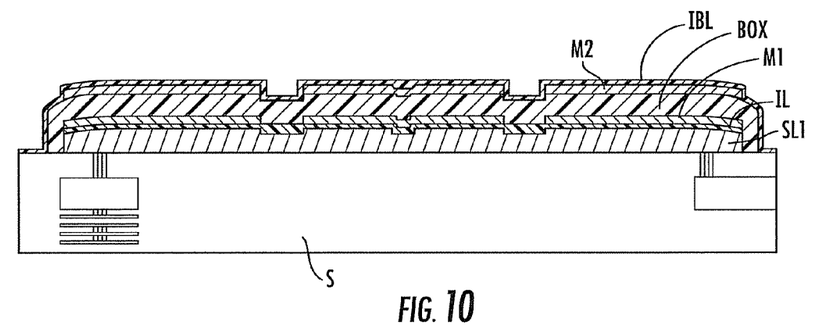

As indicated above, insulation balance layer IBL can be patterned and etched simultaneously with insulation layer IL and the beam oxide layer BOX. Further, all of the deposited layers can be submitted to a final high temperature anneal process, the thermal exposure being consistent with the materials used to build the structure. This combination of layers to form a multilayer structure is illustrated in FIG. 10.

Photolithography and etching processes can be performed on the combination of layers to define the tri-layer beam. The patterning and etch can define the outline of the beam device, which can be a switch, a tunable capacitor, a varactor, a sensor/transducer (e.g. accelerometer, rate gyro), or other device. The beam etch can terminate on lower sacrificial layer S1 after etching through the structural oxide (i.e., IL, BOX, and IBL). The patterning and etch can further define release etch holes that terminate on lower sacrificial layer S1. The etch release holes are for the release etch to access and remove lower sacrificial layer S1. In this way, the sacrificial material can be etched away through the beam cut (i.e., the perimeter and release etch holes). For example, the sacrificial material can be a polyimide layer that is partially removed by the beam cut etch (i.e., an oxide etch) and partially removed by the photoresist strip process. In this case, lower sacrificial layer S1 is not an etch stop or does not show a high selectivity to the beam cut etch or the photoresist strip. Alternatively, lower sacrificial layer S1 can be another material that is more of an etch stop for the beam cut etch and is not attacked by the photoresist strip. For instance, such a highly selective material can be silicon, copper, or aluminum.

Figure 11:
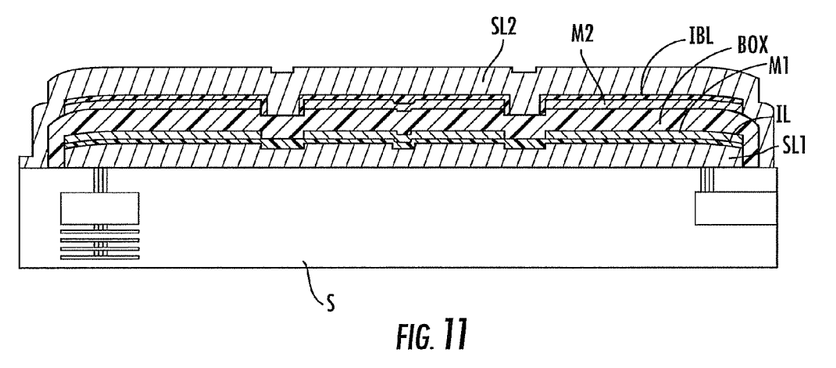

In a related embodiment, illustrated in FIG. 11, the method can further include depositing an upper sacrificial layer S2 on top of the patterned and etched beam. The upper sacrificial layer S2 can satisfy multiple functions: 1) it can create a high degree of symmetry (sac-beam-sac) for any high temperature processes following the beam definition but before release; 2) it can create a symmetric doping source when the lower sacrificial layer S1 is being used to dope layers of the tri-layer beam; 3) it can aid in the formation of a thin film encapsulation lid over the beam; and 4) it can provide a passivation barrier for the purposes of shipping. Upper sacrificial layer S2 can fill in where lower sacrificial layer S1 has been removed if the beam cut (outline and etch holes) has been patterned and etched. Upper sacrificial layer S2 can also be the second sacrificial layer if lower sacrificial layer S1 is deposited as a single layer. Further, upper sacrificial layer S2 can be the third sacrificial layer if lower sacrificial layer S1 under the beam is deposited as two layers. Further still, the upper sacrificial layer can be the (n+1)th sacrificial layer if lower sacrificial layer S1 is deposited as n layers.

Structurally, the upper sacrificial layer can be the same as the lower sacrificial layer S1 under the tri-layer beam. For instance, if lower sacrificial layer S1 is polyimide, the upper sacrificial layer can be polyimide. Alternatively, upper sacrificial layer S2 can be a different material from lower sacrificial layer S1 under the tri-layer beam. For example, lower sacrificial layer S1 can be silicon (amorphous, polysilicon, sputtered silicon), whereas the upper sacrificial layer S2 can be polyimide, or vice versa. In addition, upper sacrificial layer S2 can be planarized, either independently or in combination with the planarization of lower sacrificial layer S1.

In this embodiment having upper sacrificial layer S2, the sacrificial material can be etched both from the top of the beam and from underneath the beam through the beam cut (i.e., perimeter and release etch holes). The sacrificial etch can target a single material if the upper and lower sacrificial materials are the same. For example, the sacrificial etch for polyimide will remove polyimide that is on top and underneath the beam. Alternatively, the sacrificial etch can be comprised of multiple chemistries so that a first sacrificial etch chemistry can remove upper sacrificial layer S2 and a second sacrificial etch chemistry can remove lower sacrificial layer S1. In yet a further alternative, the sacrificial etch can be comprised of a linked sequence of chemistries to remove multiple material types or to remove material that has changed during the course of processing or removal.

The material used for one or both of lower sacrificial layer S1 and upper sacrificial layer S2 can be selected based on its material properties relative to the properties of the substrate and the device layers. In one embodiment, this relationship can mean that depositing lower sacrificial layer S1 can involve depositing a layer of a material selected to have a stiffness that is greater than a stiffness of the substrate and a stiffness of one or more of the subsequently-deposited device layers. Of course, this difference in stiffness need not be substantial. For instance, depositing lower sacrificial layer S1 can involve depositing a layer of a material selected to have a stiffness that is substantially similar to the stiffness of the substrate and the stiffness of one or more of the device layers.

Using a sacrificial layer composed of a material selected based on its properties in this way can reduce the sensitivity of the final device shape to process parameters (e.g., specific deposition temperatures, deposition temperature differences (i.e. metal versus oxide), specific material parameters (e.g., elastic modulus/CTE of sacrificial layer, plasticity properties of metals, glass transition temperature of sacrificial layers), time (e.g., deposition time, dwell time, queue time), and/or geometry (e.g., sacrificial layer thickness, device layer thickness, device layer length or aspect ratio). In addition, a sacrificial layer of this kinds can improve final as-built shape of released devices and reduces variability in the as-built shape, eliminate decoupling of the deposited layers from the substrate that can occur with a more flexible sacrificial material, and generally reduce variability of devices across a product array, die, or wafer.

The material for lower sacrificial layer S1 can also be selected to have other specific material properties that are related to the material properties of one or more of the device layers. For instance, such material properties can include the sacrificial elastic modulus, Poisson ratio, coefficient of thermal expansion, thickness, characteristic length, characteristic temperature (i.e., melting point, softening point, glass transition temperature), yield, or viscoelastic properties, which can be selected in direct relation to the corresponding properties of one or more of the device layers.

For instance, in one particular example, the material used to form lower sacrificial layer S1 can be selected to have a characteristic temperature (i.e., melting temperature, softening temperature, or glass transition temperature) that is greater than the deposition temperature of one or more of the device layers. Further, the material used for lower sacrificial layer S1 can be selected to have a coefficient of thermal expansion that is substantially similar to the coefficient of thermal expansion of one or more of the device layers.

Figure 12:
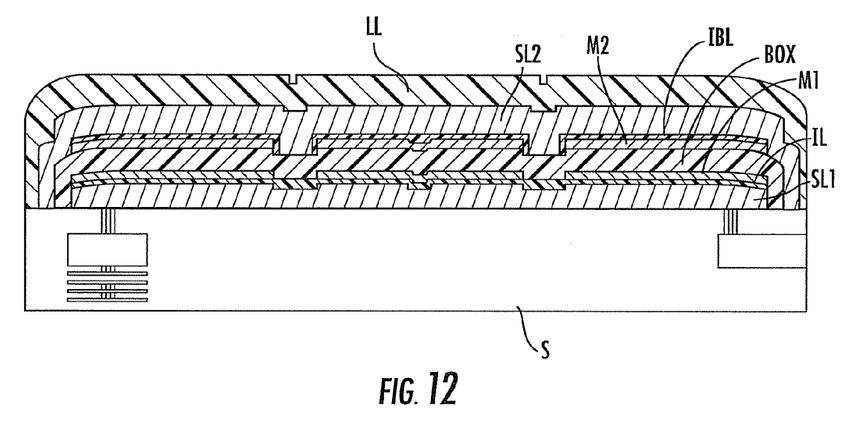
Figure 13:
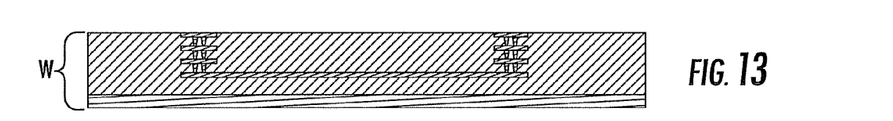
FIGS. 13 through 36 are cross-sectional side views of a multilayer structure according to another embodiment of the subject matter disclosed herein.

In another related embodiment, illustrated in FIG. 12, the method for fabricating a tri-layer beam can include depositing a lid layer LL on the substrate and over the beam and sacrificial layers. Lid layer LL can be conformal over the beam and sacrificial layers and can be the same as the underlying field oxide. In one particular example, lid layer LL can be a silicon oxide layer with a thickness of about 4-5 μm.

Lid layer LL can be patterned and etched with an array of release etch holes. These release etch holes can be sized and spaced for optimal release and sealing of lid layer LL following the deposition of the upper sacrificial layer S2. For instance, a typical size of etch release holes can be from about 1-5 μm, with a typical spacing (depending on the size of the hole) of about 10-30 μm. Further, the etch release holes can be patterned in a regular orthogonal array with the same spacing in the x and y direction. Alternatively, the etch release holes can be patterned with different spacing in the x and y direction or in an irregular pattern that is determined by the underlying device.

Similarly, the size of the etch release holes can be uniform throughout, or the etch release holes can be sized differently to address specific etch distance requirements. For example, if the thickness of upper sacrificial layer S2 is non-uniform, the holes can be larger in an area where the sacrificial material is thicker. In this way, the pitch can be constant as the hole size varies to help create a more uniform release etch. Alternatively, a more uniform release etch can be created by holding the etch hole size constant and allowing the pitch to vary non-uniformly, or by allowing both a non-uniform etch hole size and pitch. Regardless of the specific configuration, lid layer LL can be etched and the etch can terminate on the upper sacrificial layer S2. The etch selectivity between the lid etch and the sacrificial material is not a significant factor, but upper sacrificial layer S2 should not be compromised and allow the lid etch to attack underlying structural/beam materials.

In this embodiment, the sacrificial material can be etched from the top of the beam and from underneath the beam through the beam cut (i.e., perimeter and release etch holes) and through the etch release holes in lid layer LL. The release etch can target the sacrificial material on top of the beam initially (i.e., upper sacrificial layer S2). If the material of upper sacrificial layer S2 is different from that of lower sacrificial layer St a different sacrificial release chemistry can be needed to remove upper sacrificial layer S2. Once upper sacrificial layer S2 is completely removed, a second etch chemistry can be introduced to remove lower sacrificial layer S1. For example, the release etch can be an oxygen plasma to remove a polyimide upper sacrificial layer S2 and a $XeF_2$ (or $SF_6$) vapor-phase etch to remove a silicon lower sacrificial layer S1. Alternatively, the release etch can target both upper sacrificial layer S2 and lower sacrificial layer S1 where the sacrificial material is the same for both layers.

Next, the etch release holes in lid layer LL can be sealed. For instance, the holes can be sealed with a seal layer, which can be an organic or inorganic material. For example, the holes can be sealed with an organic layer of polyimide. The seal layer can further be coated with a hermetic barrier layer, which can be a dielectric (e.g., silicon oxide, silicon nitride, or a combination of both), or a metal (e.g., Al, Au, Cu). For example, a moisture barrier can be provided as a layered composite of silicon oxide plus silicon nitride. The barrier layer can be used to provide a hermetic barrier to limit moisture/gas diffusion. Alternatively, the holes can be sealed with a seal layer that can also serve as the hermetic barrier layer.

Figure 14:
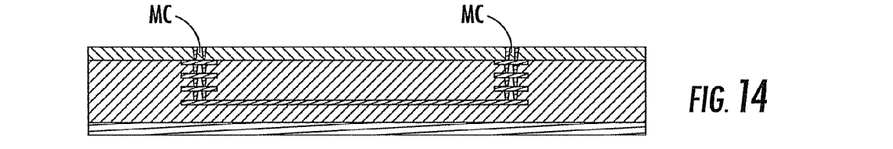
Figure 15:
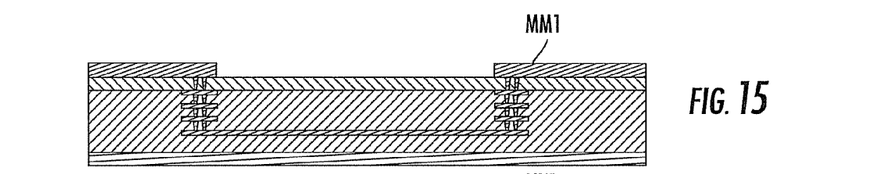
Figure 16:
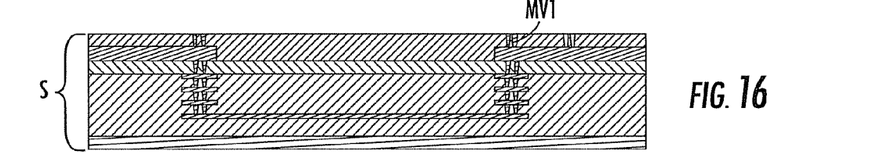

In another aspect, the present subject matter provides an alternative structure and method of fabricating a tri-layer beam, such as is illustrated in FIGS. 13 through 36. In this alternative method, a substrate S is again provided. In one example, substrate S can comprise a silicon starting wafer W with a 4-metal metal HVCMOS process, illustrated in FIG. 13. As depicted in FIG. 14, a connection MC can be created to interconnect the HVCMOS to the MEMS device to be fabricated. Referring to FIG. 15, a metal layer MM1 can be deposited and patterned. Referring to FIG. 16, an oxide layer can then be deposited above the metal layer, with a via MV1 formed to the metal layer. Thus, in this example, the structure formed by these steps shown in FIGS. 13-16 can form substrate S.

Figure 17:
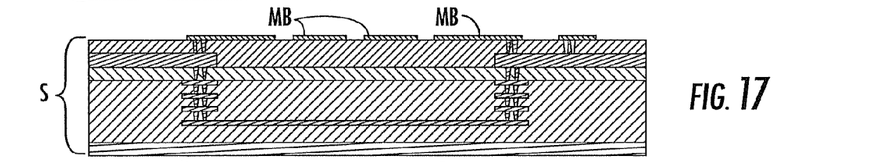

A base metal layer MB can then be deposited on the substrate, which is depicted in FIG. 17. Base metal layer MB can be deposited and patterned by sputtering, etching, liftoff, electroplating. It can be composed of aluminum (or an alloy of Al such as Al-0.5% Cu, Al-1% Si, etc), gold, copper, or other conductor. Base metal layer MB can further include an adhesion layer and a diffusion barrier as needed, and the cladding layer (i.e., combination of adhesion and diffusion layers) can be formed on both sides of the metal. For example, base metal layer MB can include a titanium/titanium nitride cladding on the bottom and top of an aluminum layer (e.g., Al-0.5% Cu).

Base metal layer MB can also be patterned into electrical interconnects, a bond pad, a fixed capacitor plate of a variable capacitor plate, one capacitor plate of a fixed capacitor, or the fixed electrode of an electrostatic actuator. In addition, base metal layer MB can interconnect to underlying electronics on the same substrate. In this arrangement, the underlying electronics can deliver the voltage to control actuation or to measure a change in capacitance.

Figure 18:
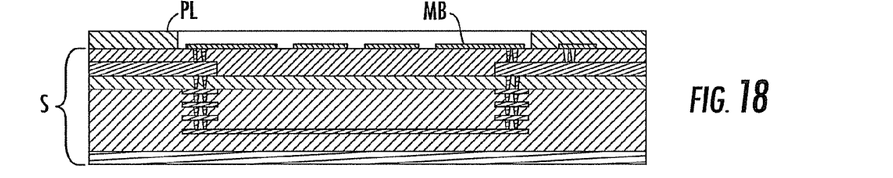
Figure 19:
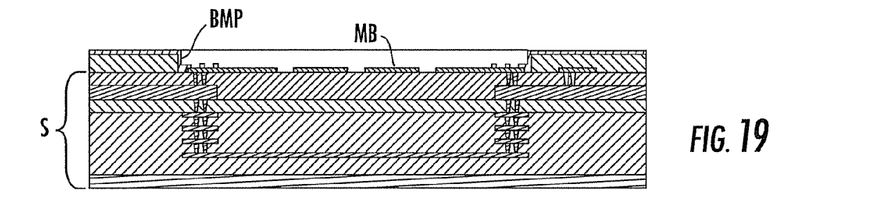
Figure 20:
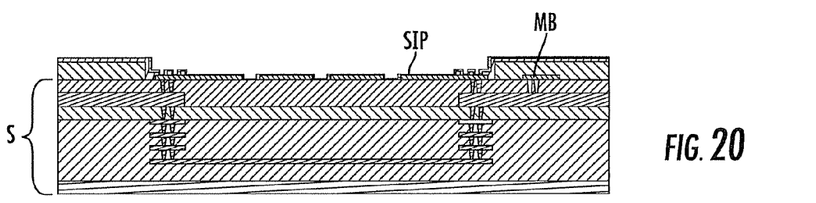
Figure 21:
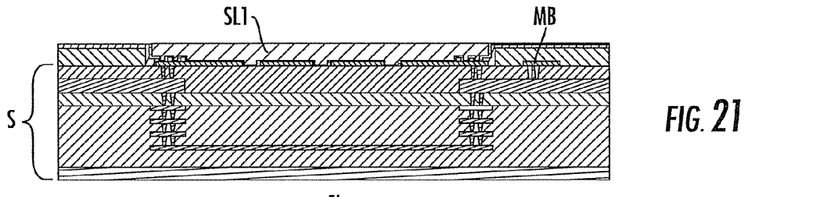
Figure 22:
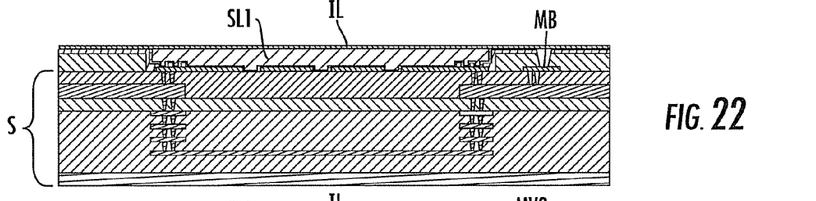
Figure 23:
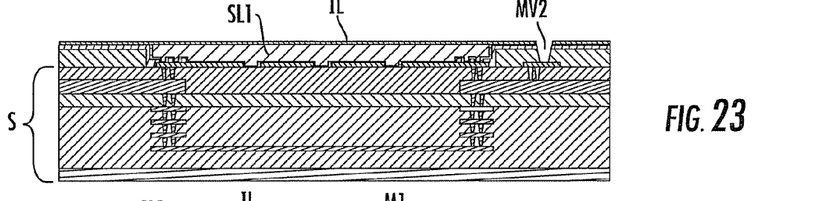
Figure 24:
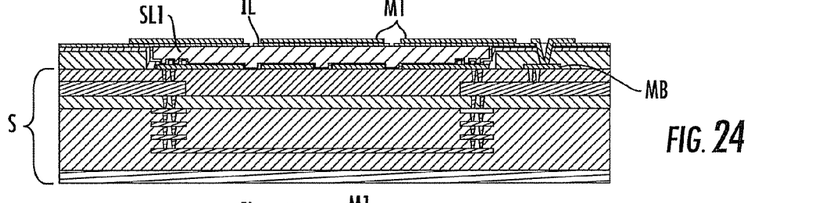
Figure 25:
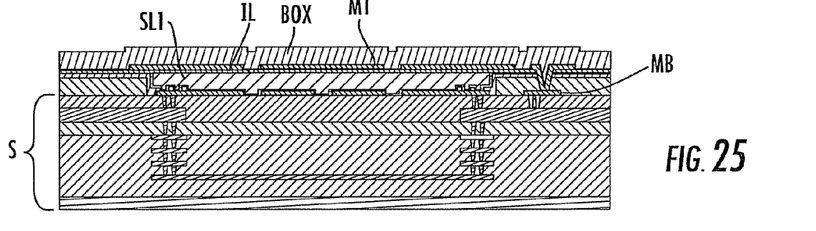
Figure 26:
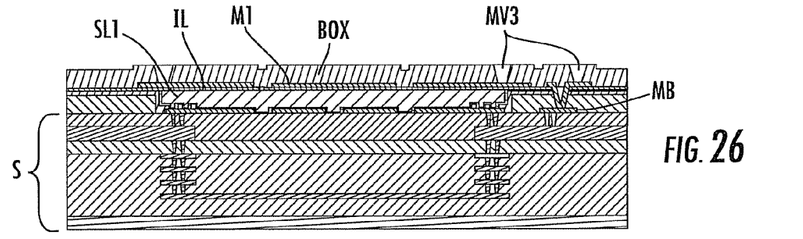
Figure 27:
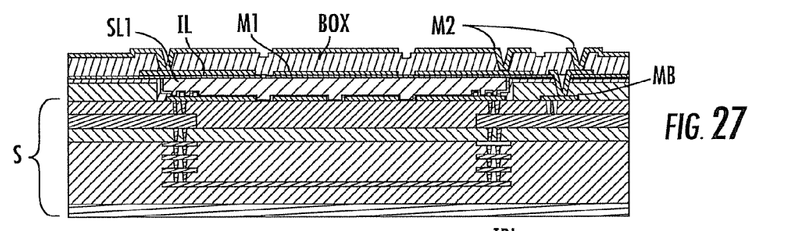
Figure 28:
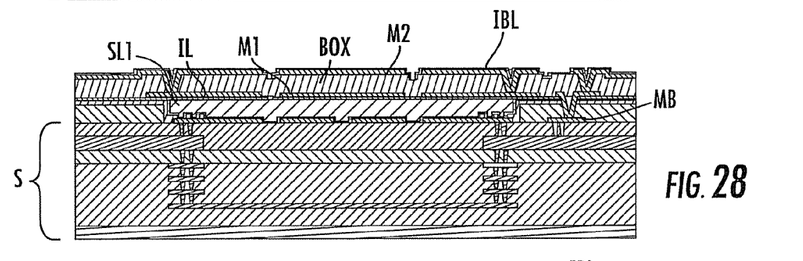
Figure 29:
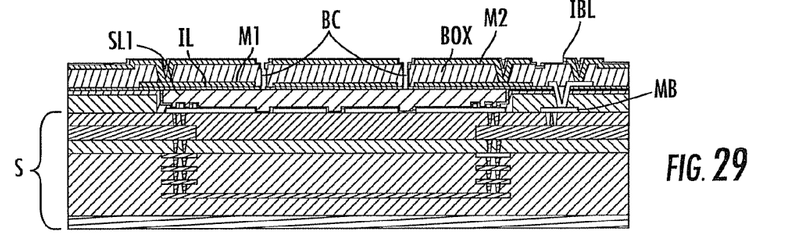

Furthermore, as is illustrated in FIG. 18, another oxide layer PL can be deposited and planarized above base metal layer MB, with a cavity etched therein. The process of achieving a planarized lower sacrificial layer SL1 can be accomplished by other integrations such as a first approach where lower sacrificial layer SL1 is deposited and patterned, it is encapsulated in a dielectric (e.g. oxide), and the oxide is planarized to expose and polish lower sacrificial layer SL1. FIG. 19 illustrates an additional oxide layer BMP that can be deposited, patterned, and etched in the cavity. Oxide layer BMP can be used for setting capacitor gaps, providing a lower capacitance density, a higher breakdown voltage, or providing actuator plate isolation. Alternatively, for a first approach, the oxide layer BMP and the forthcoming SIP layer can be processed before the deposition and patterning of lower sacrificial layer SL1 or the planarization oxide layer PL. A third alternative can be to integrate oxide layer BMP into the tri-layer process so that the oxide bumps are fabricated on the beam rather than on substrate S. Base metal layer MB on the substrate can further be encapsulated with a dielectric layer (SIP), as is depicted in FIG. 20. The SIP dielectric layer can fulfill multiple functions, such as to: 1) prevent shorting between moving and stationary electrodes (capacitor or actuator); 2) encapsulate the metallization (i.e. base metal layer MB) in a dielectric material for protection of environmental or process exposure (i.e. exposure of metal to sacrificial release) on an as-needed basis; and/or 3) define a portion of a fixed or tunable capacitor dielectric. The SIP layer can be an insulating dielectric such as silicon oxide (SiO), silicon nitride (SixNy), aluminum oxide (AlxOy), hafnium oxide (HfO), or another dielectric layer. The SIP layer can be deposited by sputtering, PECVD, spin-on, or other known process. In one example, the SIP layer can be a SiO layer with a dielectric constant of about 4 and a thickness of about 80 Å.

Figure 30:
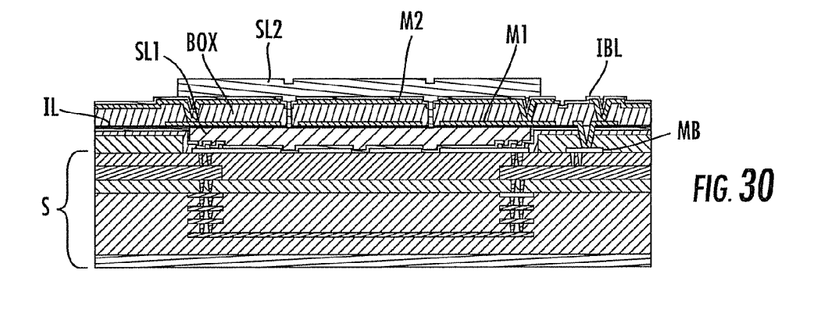
Figure 31:
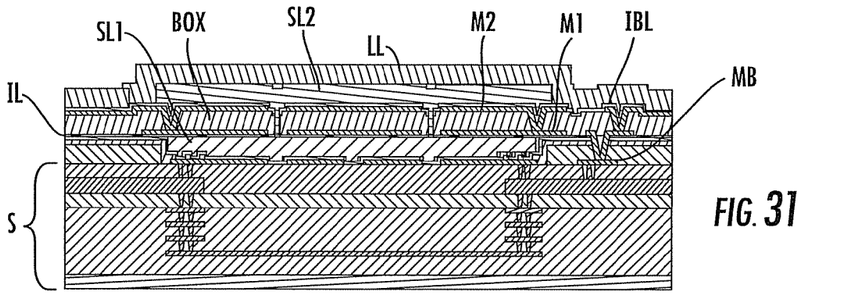
Figure 32:
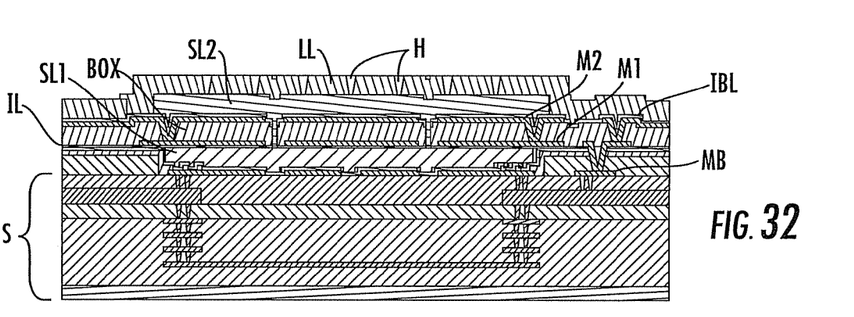
Figure 33:
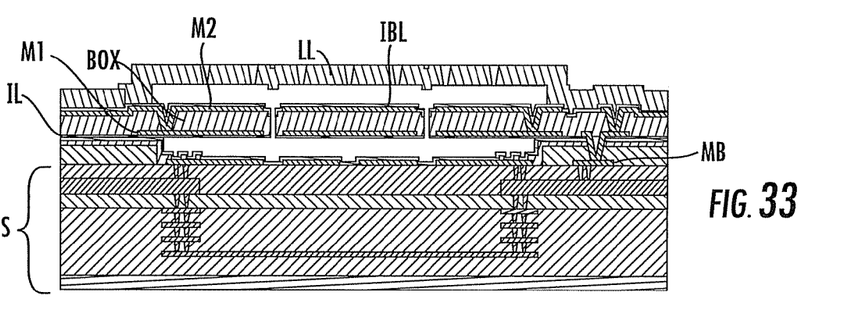
Figure 34:
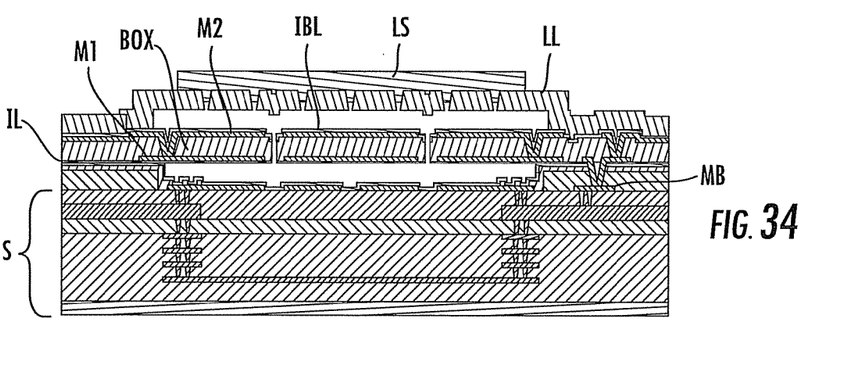
Figure 35:
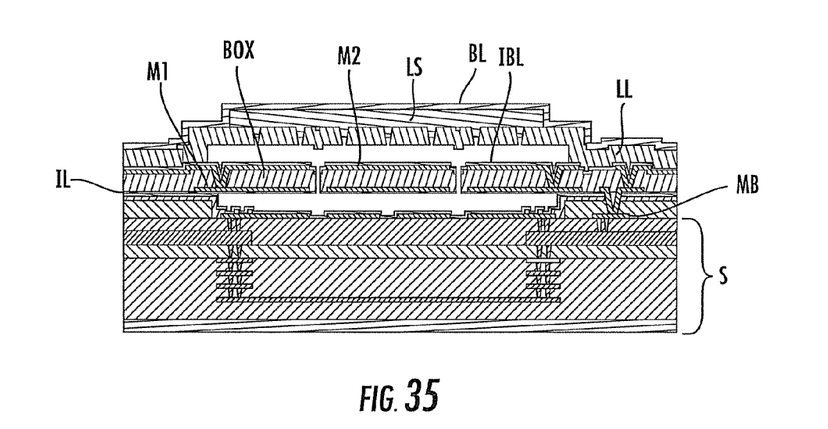

Referring now to FIGS. 21 through 29, the method can further include steps of depositing a lower sacrificial layer S1 on the substrate and on base metal layer MB and patterning lower sacrificial layer S1 into isolated islands (see FIG. 21), depositing an insulation layer IL on top of the substrate and sacrificial layers (see FIG. 22), etching a via MV2 for electrical contact between components on substrate S and subsequently-deposited device layers (see FIG. 23), depositing a first metal layer M1 on insulation layer IL on the substrate (see FIG. 24), depositing a beam oxide layer BOX over first metal layer M1 (see FIG. 25), patterning and etching vias MV3 through beam oxide layer BOX to first metal layer M1 (see FIG. 26), depositing a second metal layer M2 over beam oxide layer BOX (see FIG. 27), depositing an insulation balance layer IBL on top of beam oxide layer BOX and second metal layer M2 (see FIG. 28), defining a beam cut BC by photolithography and etching (see FIG. 29), and etching away the sacrificial material through the beam cut (perimeter and release etch holes). In addition, as is illustrated in FIG. 30, an upper sacrificial layer S2 can be deposited on top of the patterned and etched beam. Further, as is illustrated in FIG. 31, a lid layer LL can be deposited on the substrate and over the beam and sacrificial layers. In addition, lid layer LL can be patterned and etched to create holes H to upper sacrificial layer SL2 (see FIG. 32), both sacrificial layers can be removed through the etch holes (see FIG. 33), a seal layer LS can be deposited to seal the holes (see FIG. 34), a barrier layer BL can be deposited over seal layer LS (see FIG. 35), and pad openings P can be etched through the encapsulation layers (see FIG. 36). Similarly to the above described embodiments, one or both of the sacrificial layers can be planarized.

Figure 36:
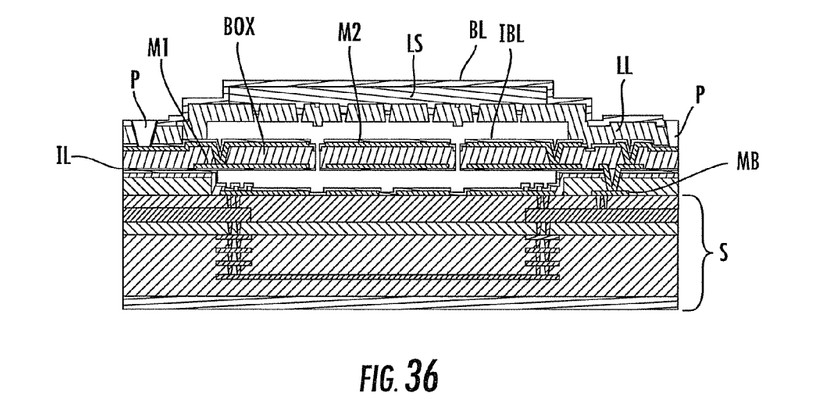

In this configuration, a capacitor can be defined between base metal layer MB and first metal layer M1, where base metal layer MB is a stationary layer and first metal layer M1 can be either a stationary or a movable layer. In one arrangement, a fixed capacitor can be defined by base metal layer MB on a substrate, and a SIP dielectric on base metal layer MB. First metal layer M1 can form the second plate of the fixed capacitor. The dielectric insulation layer IL can be deposited directly on the SIP dielectric, and first metal layer M1 can be deposited directly on insulation layer IL. The capacitor dielectric thickness can thus be defined by the sum of the thicknesses of the SIP dielectric and insulation layer IL.

Alternatively, a lower sacrificial layer S1 can be deposited on the SIP layer, which can be deposited on base metal layer MB. Dielectric insulation layer IL can then be deposited on lower sacrificial layer St and the first metal M1 can be deposited directly on insulation layer IL. After lower sacrificial layer S1 is removed, the capacitor dielectric thickness is thus defined by the sum of the thicknesses of the SIP dielectric, insulation layer IL, and the air gap created by the removal of lower sacrificial layer S1. In this arrangement, the SIP dielectric and insulation layer IL can nominally have a dielectric constant of about 4 for SiO, and the air can gap nominally have the dielectric constant of air (i.e., about 1) with a nominal thickness of about 2 μm.

In another arrangement, a tunable capacitor can be defined by base metal layer MB fixed on the substrate with a SIP dielectric on base metal layer MB. A sacrificial layer can be deposited on the SIP layer on base metal layer MB. Dielectric insulation layer IL can be deposited on lower sacrificial layer St Second metal layer M2 can be deposited directly on insulation layer IL and can form the second, movable plate of the tunable capacitor. After lower sacrificial layer S1 is removed, base metal layer MB and first metal layer M1 are separated by a distance equal to the sacrificial thickness. The "OPEN" state capacitance is determined by the thickness of the SIP dielectric, the thickness of insulation layer IL, and the thickness of the air gap, where the air gap thickness is set by the thickness of lower sacrificial layer S1 and the as-built deflection of the beam/tunable capacitor. The SIP dielectric and insulation layer IL nominally can have a dielectric constant of 4 for SiO, and the air gap nominally can have the dielectric constant of about 1 with a nominal thickness of about 2 μm (for an undeflected tunable capacitor). The "CLOSED" state of the capacitor is determined (absent curvature, roughness, and/or contamination) by the thickness of the SIP dielectric layer and thickness of insulation layer IL.

Alternatively, a tunable or fixed capacitor with a capacitance can be determined by the thicknesses of the SIP dielectric and insulation layer IL. The nominal target for the thicknesses of the SIP dielectric and insulation layer IL can be 80 Å and 0.15 μm, respectively. The SIP dielectric layer functions as an encapsulation layer, sacrificial etch and environmental (passivation) layer, and as a capacitor dielectric. Insulation layer IL can function as an etch stop, a barrier between lower sacrificial layer S1 and any subsequent chemical processes (photoresist strip), and a capacitor dielectric. The total thickness can be targeted to meet capacitance density requirements and voltage breakdown requirements.

The distribution the thicknesses of the SIP dielectric and insulation layer IL can differ depending on specific requirements. For instance, if the barrier and passivation functions of the SIP dielectric are not required, the SIP dielectric layer can be eliminated, which eliminates a clean and deposition step but not a masking step. If the metal etch stop and sacrificial protection are not required functions of insulation layer IL, insulation layer IL can be eliminated, and the SIP layer thickness can be increased to meet the capacitance requirements (nominally 0.15 μm). By eliminating insulation layer IL, the structure of the beam can be simplified because insulation layer IL deposition and insulation balance layer IBL deposition can both be eliminated. In addition, the critical dielectric thickness can be measured by a single layer (i.e., the SIP dielectric thickness), rather than a multiple layer deposition (i.e., combination of the SIP dielectric and insulation layer IL).

It will be understood that various details of the presently disclosed subject matter may be changed without departing from the scope of the presently disclosed subject matter. Furthermore, the foregoing description is for the purpose of illustration only, and not for the purpose of limitation.

What is claimed is:

1. A method for fabricating a multilayer structure for a micro electromechanical device, the method comprising:
   depositing a lower sacrificial layer on a substrate;
   patterning the lower sacrificial layer into isolated islands;
   depositing an insulation layer on the substrate and the lower sacrificial layer;
   depositing a first metal layer on the insulation layer;
   depositing a beam oxide layer on the first metal layer;
   depositing a second metal layer on the beam oxide layer;

depositing an insulation balance layer on the beam oxide layer and second metal layer;

creating perimeter and release holes in one or more of the deposited layers; and etching away the lower sacrificial layer through the perimeter and release etch holes.

2. The method of claim 1, wherein depositing the insulation balance layer comprises depositing a layer of a material having the same composition and thickness as the insulation layer.

3. The method of claim 1, wherein depositing the insulation balance layer comprises encapsulating the second metal layer.

4. The method of claim 1, further comprising etching an electrical via through the insulation layer.

5. The method of claim 1, further comprising patterning the first metal layer.

6. The method of claim 5, wherein patterning the first metal layer occurs by electroplating through a patterned electroplating template, lift-off using an appropriate lift-off template, wet etching with an appropriate etch mask, or dry etching with an appropriate etch mask.

7. The method of claim 1, further comprising patterning the beam oxide layer to etch vias for electrical connection between the first metal layer and the second metal layer.

8. The method of claim 1, further comprising patterning the second metal layer.

9. The method of claim 8, wherein patterning the second metal layer occurs by electroplating through a patterned electroplating template, lift-off using an appropriate lift-off template, wet etching with an appropriate etch mask, or dry etching with an appropriate etch mask.

10. The method of claim 1, further comprising simultaneously patterning the insulation layer, the beam oxide layer, and the insulation balance layer.

11. The method of claim 1, further comprising:
depositing an upper sacrificial layer on the patterned and etched multilayer structure; and
etching away the lower sacrificial layer and the upper sacrificial layer through the perimeter and release etch holes.

12. The method of claim 11, wherein etching away the lower sacrificial layer and the upper sacrificial layer comprises etching the upper sacrificial layer with a first etch chemistry and etching the lower sacrificial layer with a second etch chemistry.

13. The method of claim 1, further comprising:
depositing an upper sacrificial layer on the patterned and etched multilayer structure;
depositing a lid layer on the substrate and over the multilayer structure and the upper sacrificial layer;
etching away the lower sacrificial layer and the upper sacrificial layer through the perimeter and release etch holes and the etch release holes in the lid layer; and
sealing the etch release holes in the lid layer.

14. The method of claim 13, wherein sealing the etch release holes in the lid layer comprises applying a seal layer and coating the seal layer with a barrier layer.

15. A method of fabricating a multilayer structure for a micro electromechanical device, the method comprising:
depositing a base metal layer on a substrate;
depositing a lower sacrificial layer on the substrate and the base metal layer;
patterning the lower sacrificial layer into isolated islands;
depositing an insulation layer on the substrate and the lower sacrificial layer;
depositing a first metal layer on the insulation layer on the substrate, wherein a capacitor is defined between the base metal layer and the first metal layer;
depositing a beam oxide layer on the first metal layer;
depositing a second metal layer on the beam oxide layer;
depositing an insulation balance layer on the beam oxide layer and the second metal layer;
creating perimeter and release holes in one or more of the deposited layers; and
etching away the lower sacrificial layer through the perimeter and release etch holes.

16. The method of claim 15, further comprising encapsulating the base metal layer with a dielectric layer prior to depositing the lower sacrificial layer.

17. The method of claim 15, further comprising:
depositing an upper sacrificial layer on the patterned and etched multilayer structure; and
etching away the lower sacrificial layer and the upper sacrificial layer through the perimeter and release etch holes.

18. The method of claim 15, further comprising:
depositing an upper sacrificial layer on the patterned and etched multilayer structure;
depositing a lid layer on the substrate over the multilayer structure and upper sacrificial layer;
etching away the lower sacrificial layer and the upper sacrificial layer through the perimeter and release etch holes and the etch release holes in the lid layer; and
sealing the etch release holes in the lid layer.

19. A method for fabricating a multilayer structure for a micro electro-mechanical device, the method comprising:
depositing a lower sacrificial layer on a substrate;
patterning the lower sacrificial layer into isolated islands, wherein patterning the lower sacrificial layer into isolated islands comprises fully removing the lower sacrificial layer from all interfaces where it is not part of an isolated island;
depositing an insulation layer on the substrate and the lower sacrificial layer;
depositing a first metal layer on the insulation layer;
depositing a beam oxide layer on the first metal layer;
depositing a second metal layer on the beam oxide layer;
depositing an insulation balance layer on the beam oxide layer and second metal layer; and
patterning and etching the deposited layers to define a multilayer structure.

* * * * *